United States Patent [19]
Jacobson

[11] Patent Number: 6,120,588
[45] Date of Patent: Sep. 19, 2000

[54] ELECTRONICALLY ADDRESSABLE MICROENCAPSULATED INK AND DISPLAY THEREOF

[75] Inventor: Joseph M. Jacobson, Cambridge, Mass.

[73] Assignee: E Ink Corporation, Cambridge, Mass.

[21] Appl. No.: 08/935,800

[22] Filed: Sep. 23, 1997

Related U.S. Application Data

[63] Continuation-in-part of application No. PCT/US96/13469, Aug. 20, 1996.

[60] Provisional application No. 60/035,622, Sep. 24, 1996, and provisional application No. 60/022,222, Jul. 19, 1996.

[51] Int. Cl.[7] .................................................. C09D 11/00
[52] U.S. Cl. ................................. 106/31.16; 106/31.32; 106/31.64; 106/31.92
[58] Field of Search .............................. 106/31.92, 31.16, 106/31.32, 31.64; 264/6, 10, 12, 7; 425/6, 130, 174.8 E; 427/288, 457, 458, 469, 479, 483; 345/105, 106, 107

[56] References Cited

U.S. PATENT DOCUMENTS

| | | | |
|---|---|---|---|
| 3,036,388 | 5/1962 | Tate | 35/66 |
| 3,406,363 | 10/1968 | Tate | 335/302 |
| 3,460,248 | 8/1969 | Tate | 29/607 |
| 3,668,106 | 6/1972 | Ota et al. | 204/299 R |
| 3,670,323 | 6/1972 | Sobel et al. | 340/324 |
| 3,756,693 | 9/1973 | Ota et al. | 345/107 |
| 3,767,392 | 10/1973 | Ota et al. | 430/35 |
| 3,792,308 | 2/1974 | Ota | 315/150 |
| 3,892,568 | 7/1975 | Ota | 96/1.3 |
| 4,062,009 | 12/1977 | Raverdy et al. | 340/324 |
| 4,093,534 | 6/1978 | Carter et al. | 350/355 |
| 4,126,528 | 11/1978 | Chiang | 204/180 |
| 4,126,854 | 11/1978 | Sheridon | 340/373 |
| 4,143,103 | 3/1979 | Sheridon | 264/4 |
| 4,143,472 | 3/1979 | Murata et al. | 35/66 |

(List continued on next page.)

FOREIGN PATENT DOCUMENTS

| | | |
|---|---|---|
| 0 186 710 A1 | 7/1986 | European Pat. Off. . |
| 62-058222 | 3/1987 | European Pat. Off. . |
| 62-231930 | 10/1987 | European Pat. Off. . |
| 0 268 877 A2 | 6/1988 | European Pat. Off. . |
| 0 268 877 A3 | 6/1988 | European Pat. Off. . |
| 0 281 204 A2 | 9/1988 | European Pat. Off. . |
| 0 443 571 A2 | 8/1991 | European Pat. Off. . |
| 0 540 281 A2 | 5/1993 | European Pat. Off. . |
| 0 525 852 B1 | 5/1996 | European Pat. Off. . |
| 0 721 176 A2 | 7/1996 | European Pat. Off. . |
| 0 721 176 A3 | 11/1996 | European Pat. Off. . |

(List continued on next page.)

OTHER PUBLICATIONS

Beilin et al., "8.5: 2000–Character Electrophoretic Display", *SID 86 Digest*, 136–140 (1986).

Bohnke et al., "Polymer–Based Solid Electrochromic Cell for Matrix–Addressable Display Devices", vol. 138, No. 12: 3612–3617 (1991). (No Month).

Bryce, "Seeing through synthetic metals", vol. 335: 12–13 (1988). (No Month).

"Capsule Wall Treatment", 157–193.

(List continued on next page.)

*Primary Examiner*—Diana Dudash
*Assistant Examiner*—Paul D. Strain
*Attorney, Agent, or Firm*—Testa, Hurwitz & Thibeault LLP

[57] ABSTRACT

We describe a system of electronically active inks which may include electronically addressable contrast media, conductors, insulators, resistors, semiconductive materials, magnetic materials, spin materials, piezoelectric materials, optoelectronic, thermoelectric or radio frequency materials. We further describe a printing system capable of laying down said materials in a definite pattern. Such a system may be used for instance to: print a flat panel display complete with onboard drive logic; print a working logic circuit onto any of a large class of substrates; print an electrostatic or piezoelectric motor with onboard logic and feedback or print a working radio transmitter or receiver.

18 Claims, 16 Drawing Sheets

U.S. PATENT DOCUMENTS

| | | | |
|---|---|---|---|
| 4,231,641 | 11/1980 | Randin | 350/357 |
| 4,261,653 | 4/1981 | Goodrich | 350/362 |
| 4,272,596 | 6/1981 | Harbour et al. | 430/37 |
| 4,298,448 | 11/1981 | Miller et al. | 204/299 |
| 4,305,807 | 12/1981 | Somlyody | 204/299 |
| 4,311,361 | 1/1982 | Somlyody | 350/267 |
| 4,368,952 | 1/1983 | Murata et al. | 350/362 |
| 4,390,403 | 6/1983 | Batchelder | 204/180 |
| 4,418,346 | 11/1983 | Batchelder | 340/787 |
| 4,419,383 | 12/1983 | Lee | 427/47 |
| 4,438,160 | 3/1984 | Ishikawa et al. | 427/214 |
| 4,620,916 | 11/1986 | Zwemer et al. | 204/299 |
| 4,643,528 | 2/1987 | Bell, Jr. | 350/334 |
| 4,726,662 | 2/1988 | Cromack | 350/345 |
| 4,772,102 | 9/1988 | Fergason et al. | 350/338 |
| 4,824,208 | 4/1989 | Fergason et al. | 350/276 |
| 4,832,458 | 5/1989 | Fergason et al. | 350/338 |
| 4,936,916 | 6/1990 | Shinmitsu et al. | 523/211 X |
| 5,017,225 | 5/1991 | Nakanishi et al. | 106/21 |
| 5,057,363 | 10/1991 | Nakanishi | 428/321.5 |
| 5,105,185 | 4/1992 | Nakanowatari et al. | 340/784 |
| 5,151,032 | 9/1992 | Igawa | 434/409 |
| 5,160,371 | 11/1992 | Ito | 106/31.16 |
| 5,179,065 | 1/1993 | Ito | 106/31.16 |
| 5,187,609 | 2/1993 | DiSanto et al. | 359/296 |
| 5,262,098 | 11/1993 | Crowley et al. | 264/8 |
| 5,270,843 | 12/1993 | Wang | 359/52 |
| 5,279,511 | 1/1994 | DiSanto et al. | 445/24 |
| 5,298,833 | 3/1994 | Hou | 313/483 |
| 5,344,594 | 9/1994 | Sheridon | 264/4.1 |
| 5,360,689 | 11/1994 | Hou et al. | 430/34 |
| 5,383,008 | 1/1995 | Sheridon | 355/256 |
| 5,389,945 | 2/1995 | Sheridon | 345/85 |
| 5,398,131 | 3/1995 | Hall et al. | 359/465 |
| 5,403,518 | 4/1995 | Schubert | 252/572 |
| 5,411,398 | 5/1995 | Nakanishi et al. | 434/409 |
| 5,411,656 | 5/1995 | Schubert | 204/299 |
| 5,498,674 | 3/1996 | Hou et al. | 525/369 |
| 5,508,068 | 4/1996 | Nakano | 428/1 |
| 5,512,162 | 4/1996 | Sachs et al. | 205/91 |
| 5,573,711 | 11/1996 | Hou et al. | 252/572 |
| 5,582,700 | 12/1996 | Bryning et al. | 204/450 |
| 5,627,561 | 5/1997 | Laspina et al. | 345/107 |
| 5,639,914 | 6/1997 | Tomiyama et al. | 564/309 |
| 5,643,673 | 7/1997 | Hou | 428/402.24 |
| 5,663,224 | 9/1997 | Emmons et al. | 524/188 |
| 5,707,738 | 1/1998 | Hou | 428/402 |
| 5,707,747 | 1/1998 | Tomiyama et al. | 428/457 |
| 5,708,525 | 1/1998 | Sheridon | 359/296 |
| 5,717,283 | 2/1998 | Biegelsen et al. | 313/483 |
| 5,717,514 | 2/1998 | Sheridon | 359/296 |
| 5,736,074 | 4/1998 | Hayes et al. | 264/7 X |
| 5,737,115 | 4/1998 | Mackinlay et al. | 359/296 |
| 5,738,977 | 4/1998 | Van Der Sluis-Van Voort et al. | 430/313 |
| 5,739,801 | 4/1998 | Sheridon | 345/84 |
| 5,744,283 | 4/1998 | Spierings et al. | 430/313 |
| 5,745,094 | 4/1998 | Gordon, II et al. | 345/107 |
| 5,751,268 | 5/1998 | Sheridon | 345/107 |
| 5,754,332 | 5/1998 | Crowley | 359/296 |
| 5,760,761 | 6/1998 | Sheridon | 345/107 |
| 5,767,826 | 6/1998 | Sheridon et al. | 345/84 |

FOREIGN PATENT DOCUMENTS

| | | |
|---|---|---|
| 59-098227 | 6/1984 | Japan . |
| 60-189731 | 9/1985 | Japan . |
| 01086116 | 3/1989 | Japan . |
| 01086117 | 3/1989 | Japan . |
| 2551783 | 3/1989 | Japan . |
| 01142537 | 6/1989 | Japan . |
| 01248182 | 10/1989 | Japan . |
| 02223934 | 9/1990 | Japan . |
| 02223935 | 9/1990 | Japan . |
| 02223936 | 9/1990 | Japan . |
| 02284124 | 11/1990 | Japan . |
| 02284125 | 11/1990 | Japan . |
| 05165064 | 6/1993 | Japan . |
| 05173194 | 7/1993 | Japan . |
| 05307197 | 11/1993 | Japan . |
| 6089081 | 3/1994 | Japan . |
| 950181574 | 2/1997 | Japan . |
| 10-149118 | 6/1998 | Japan . |
| 2 306 229 | 10/1995 | United Kingdom . |
| WO 92/20060 | 11/1992 | WIPO . |
| WO 92/21733 | 12/1992 | WIPO . |
| WO 93/02443 | 2/1993 | WIPO . |
| WO 93/04458 | 3/1993 | WIPO . |
| WO 93/04459 | 3/1993 | WIPO . |
| WO 93/05425 | 3/1993 | WIPO . |
| WO 93/07608 | 4/1993 | WIPO . |
| WO 94/24236 | 10/1994 | WIPO . |
| WO 95/02636 | 1/1995 | WIPO . |
| WO 95/05622 | 2/1995 | WIPO . |
| WO 95/06307 | 3/1995 | WIPO . |
| WO 95/07527 | 3/1995 | WIPO . |
| WO 95/10107 | 4/1995 | WIPO . |
| WO 95/15363 | 6/1995 | WIPO . |
| WO 95/19227 | 7/1995 | WIPO . |
| WO 95/27924 | 10/1995 | WIPO . |
| WO 95/33085 | 12/1995 | WIPO . |
| WO 97/35298 | 9/1997 | WIPO . |

OTHER PUBLICATIONS

Chiang, "Conduction Mechanism of Charge Control Agents Used in Electrophoretic Display Devices", Proceeding of the SID, vol. 183, No. 3 & 4: 275–282 (1977). (No Month).

Croucher et al., "Electrophoretic Display: Materials as Related to Performance", vol. 25, No. 2: 80–86 (1981). (No Month).

Dalisa, "Electrophoretic Display Technology", vol. ED–24, No. 7: 827–834 (1977). (No Month).

Egashira et al., "A Solid Electrochromic Cell Consisting of Lu–Diphthalocyanine and Lead Fluoride", Proceedings of the SID, vol. 28, No. 3: 227–232 (1987). (No Month).

"Field–Effect Transistor with Diphthalocyanine Thin Film", *Electronics Letters,* vol. 24, No. 11:674–675 (May 26, 1988).

Fitzhenry, "Optical effects of adsorption of dyes on pigment used in electrophoretic image displays", Applied Optics, vol. 18, No. 19: 3332–3342 (1979). (No Month).

Fitzhenry, "Optical Properties of Electrophoretic Image Displays", *IEEE,* 300–309 (1981). (No Month).

Goodman, "Passive Liquid Displays; Liquid Crystals, Electrophoretics, and Electrochromics", Proceeding of the SID, vol. 17, No. 1: 30–38 (1976). (No Month).

Hatano et al., "18.3 Bistable Paper–White Display Device Using Cholesteric Liquid Crystals," *SID 96 Digest,* 269–272 (1996). (No Month).

Ji et al., "P–50: Polymer Walls in Higher–Polymer–Content Bistable Reflective Cholesteric Displays", *SID 96 Digest,* 611–613 (1996). (No Month).

Jin et al., "Optically Transparent, Electrically Conductive Composite Medium", 446–448 (1992). (No Month).

Lee, "Fabrication of Magnetic Particles Displays", Proceeding of the SID, vol. 18, No. 3 & 4: 283–288 (1977). (No Month).

Lewis et al., "Gravitational, Inter–Particle and Partical–Electrode Forces in the Electrophoretic Display", Proceeding of the SID, vol. 18, No. 3 & 4: 235–242 (1977). (No Month).

Pearlstein, "Electroless Plating", *Modern Electroplating,* 710–747.

M. Gutcho, "Microencapsulation with Synthetic Polymeric Film Formers", *Microcapsules and Microencapsulation Techniques,* 65–130 (1976). No Month.

Mürau et al., "The Understanding and Elimination of Some Suspension Instabilities in an electrophoretic Display", *J. Appl. Phys.,* vol. 49, No. 9: 4820–4829 (1978). (No Month).

Ota et al., "Developments in Electrophoretic Displays", Proceeding of the SID, vol. 18, No. 3 &4: 243–254 (1977). (No Month).

Ota et al., "Electrophoretic display devices", Laser 75 Optoelectronics Conference Proceedings, 145–148. (No Date).

Ota et al., "Electrophoretic Image Display (EPID) Panel", *Proceedings of the IEEE,* 1–5 (1973).

Pankove, "Color Reflection Type Display Panel", 1–2 (1962).

Saitoh et al., "A Newly Developed Electrical Twisting Ball Display", Proceedings of the SID, vol. 23, No. 4: 249–253 (1982).

Sheridon et al., "The Gyricon–A Twisting Ball Display", Proceeding of the SID, vol. 18, No. 3 & 4: 289–293 (1977).

Vance, "Optical Characteristics of Electrophoretic Displays", Proceeding of the SID, vol. 18, No. 3 & 4: 267–274 (1977).

Vaz et al., "Dual frequency addressing a polymer–dispersed liquid–crystal films", *Journal of Applied Physics,* vol. 65, No. 12:5043–5050 (Jun. 15, 1989).

Yang et al., "A new architecture for polymer transistors", *Nature,* vol. 372, No. 24: 344–346 (1994).

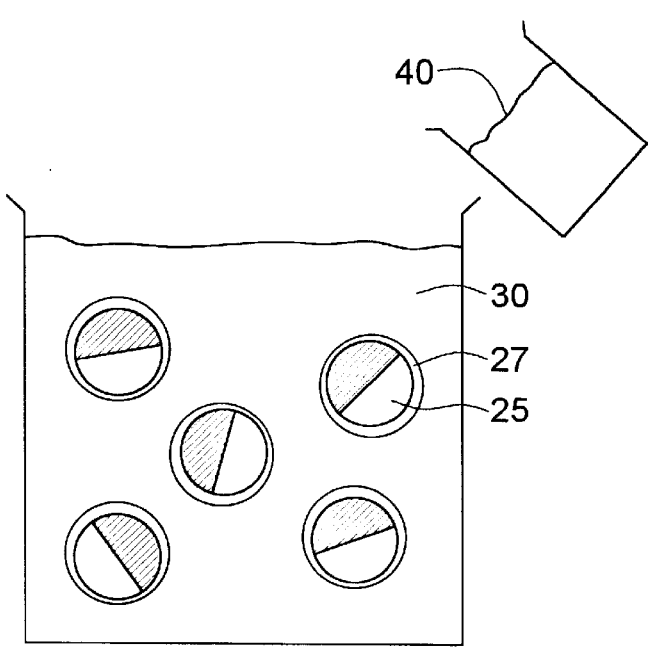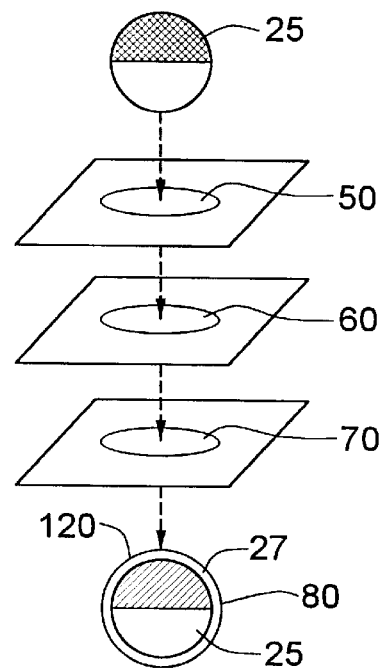
FIG. 2A
FIG. 2B
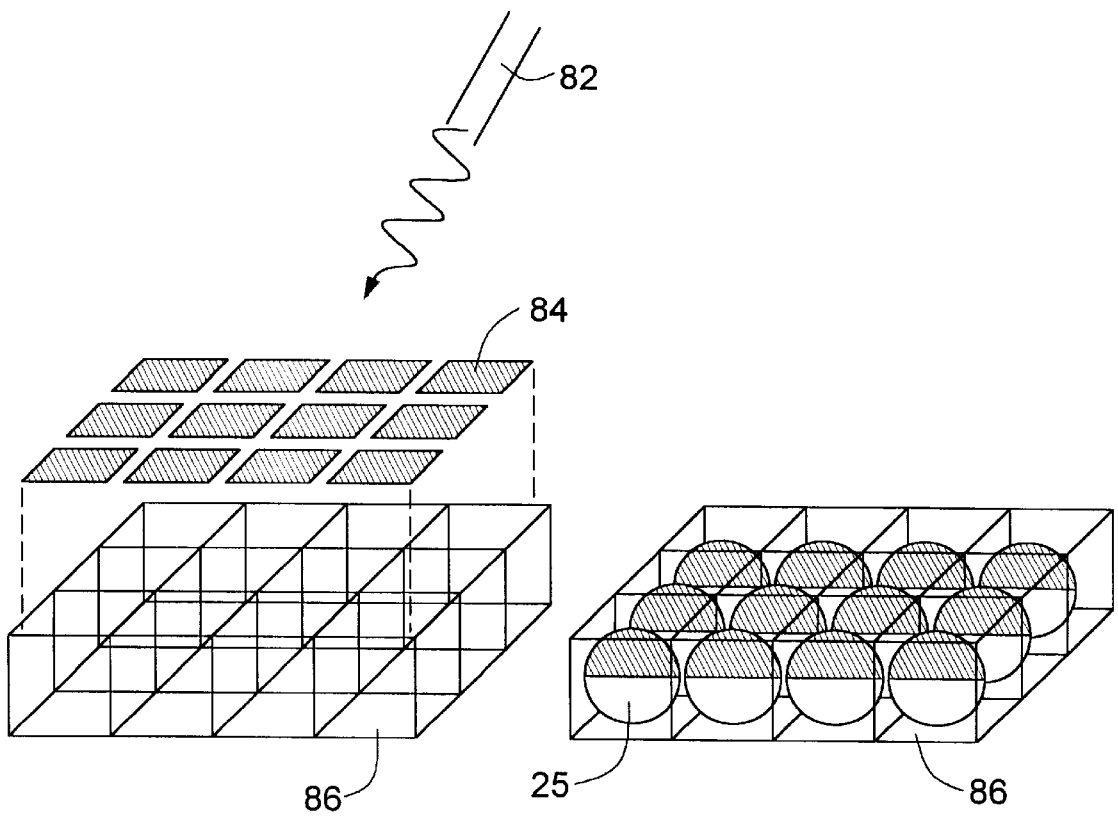
FIG. 2C

ELECTRONICALLY ADDRESSABLE MICROENCAPSULATED INK AND DISPLAY THEREOF

RELATED APPLICATIONS

This application claims priority to U.S. Provisional Application No. 60/035,622, filed Sep. 24, 1996 and claims priority to and is a continuation-in-part of International application PCT/US96/13469, filed Aug. 20, 1996 which claims priority to U.S. Provisional Application No. 60/022,222, filed Jul. 19, 1996 the contents of which are incorporated herein by reference in their entirety.

BACKGROUND

Currently, printing of conductors and resistors is well known in the art of circuit board manufacture. In order to incorporate logic elements the standard practice is to surface mount semiconductor chips onto said circuit board. To date there does not exist a system for directly printing said logic elements onto an arbitrary substrate.

In the area of flat panel display drivers there exists technology for laying down logic elements onto glass by means of vacuum depositing silicon or other semiconductive material and subsequently etching circuits and logic elements. Such a technology is not amenable to laying down logic elements onto an arbitrary surface due to the presence of the vacuum requirement and the etch step.

In the area of electronically addressable contrast media (as may be used to effect a flat panel display) emissive and reflective electronically active films (such as electroluminscent and electrochromic films), polymer dispersed liquid crystal films, and bichromal microsphere elastomeric slabs are known. No such directly electronically addressable contrast medium however is amenable to printing onto an arbitrary surface.

Finally in the area of surface actuators electrostatic motors, which may be etched or non-etched, are known in the art. In the first case, such etched devices suffer from their inability to be fabricated on arbitrary surfaces. In the second case, non-etched devices suffer from the inability to incorporate drive logic and electronic control directly onto the actuating surface.

It is an object of the present disclosure to overcome the limitations of the prior art in the area of printable logic, display and actuation.

SUMMARY OF THE INVENTION

In general the present invention provides a system of electronically active inks and means for printing said inks in an arbitrary pattern onto a large class of substrates without the requirements of standard vacuum processing or etching. Said inks may incorporate mechanical, electrical or other properties and may provide but are not limited to the following function: conducting, insulating, resistive, magnetic, semiconductive, light modulating, piezoelectric, spin, optoelectronic, thermoelectric or radio frequency.

In one embodiment this invention provides for a microencapsulated electric field actuated contrast ink system suitable for addressing by means of top and bottom electrodes or solely bottom electrodes and which operates by means of a bichromal dipolar microsphere, electrophoretic, dye system, liquid crystal, electroluminescent dye system or dielectrophoretic effect. Such an ink system may be useful in fabricating an electronically addressable display on any of a large class of substrate materials which may be thin, flexible and may result in an inexpensive display.

In another embodiment this invention provides for a semiconductive ink system in which a semiconductor material is deployed in a binder such that when said binder is cured a percolated structure with semiconductive properties results.

In another embodiment this invention for provides for systems capable of printing an arbitrary pattern of metal or semiconductive materials by means of photoreduction of a salt, electron beam reduction of a salt, jet electroplating, dual jet electroless plating or inert gas or local vacuum thermal, sputtering or electron beam deposition.

In another embodiment this invention provides for semiconductor logic elements and electro-optical elements which may include diode, transistor, light emitting, light sensing or solar cell elements which are fabricated by means of a printing process or which employ an electronically active ink system as described in the aforementioned embodiments. Additionally said elements may be multilayered and may form multilayer logic including vias and three dimensional interconnects.

In another embodiment this invention provides for analog circuits elements which may include resistors, capacitors, inductors or elements which may be used in radio applications or magnetic or electric field transmission of power or data.

In another embodiment this invention provides for an electronically addressable display in which some or all of address lines, electronically addressable contrast media, logic or power are fabricated by means of a printing process or which employ an electronically active ink system as described in the aforementioned embodiments. Such display may further comprise a radio receiver or transceiver and power means thus forming a display sheet capable of receiving wireless data and displaying the same.

In another embodiment this invention provides for an electrostatic actuator or motor which may be in the form of a clock or watch in which some or all of address lines, logic or power are fabricated by means of a printing process or which employ an electronically active ink system as described in the aforementioned embodiments.

In another embodiment this invention provides for a wrist watch band which includes an electronically addressable display in which some or all of address lines, electronically addressable contrast media, logic or power are fabricated by means of a printing process or which employ an electronically active ink system as described in the aforementioned embodiments. Said watch band may be formed such that it has no external connections but rather receives data and or power by means of electric or magnetic field flux coupling by means of an antennae which may be a printed antennae.

In another embodiment this invention provides for a spin computer in which some or all of address lines, electronically addressable spin media, logic or power are fabricated by means of a printing process or which employ an electronically active ink system as described in the aforementioned embodiments.

Further features and aspects will become apparent from the following description and from the claims.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIGS. 2A, 2B and 2C are schematic representations of means of microencapsulation.

FIGS. 9A, 9B, 9C, 9D, and 9E are schematic representations of electronic ink systems and means for printing the same.

FIGS. 10E, 10F, 10G, and 10H are schematic diagrams of printed analog circuit elements.

DETAILED DESCRIPTION OF A PREFERRED EMBODIMENT

Means are known in the prior art for producing bichromal particles or microspheres for use in electronic displays. Such techniques produce a particle that does not have an implanted dipole moment but rather relies in general on the Zeta potential of the material to create a permanent dipole. Such a scheme suffers from the fact that it links the material properties to the electronic properties thus limiting the size of the dipole moment which may be created. FIG. 1 details means of producing particles, either bichromal as might be used in an electrostatic display, or monochromal as might be used in a dielectrophoretic display, with an implanted dipole moment.

Figure 1B:
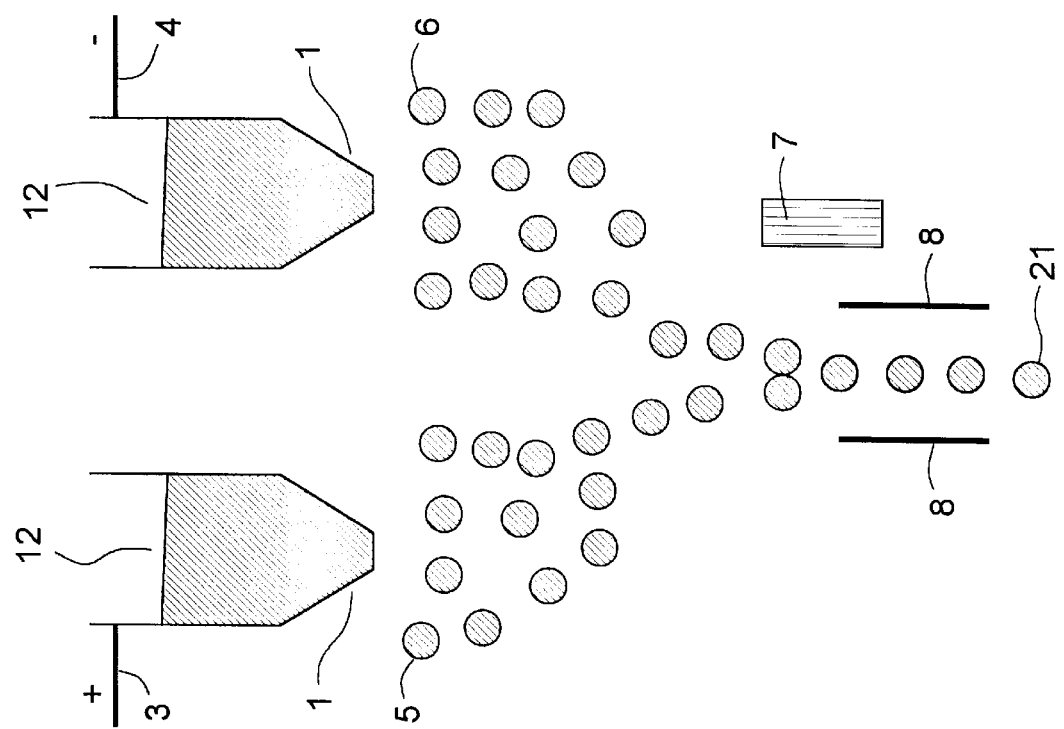
FIGS. 1A, 1B, 1C, 1D, 1E, and 1F are schematic representations of means of fabricating particles with a permanent dipole moment.
Figure 1A:
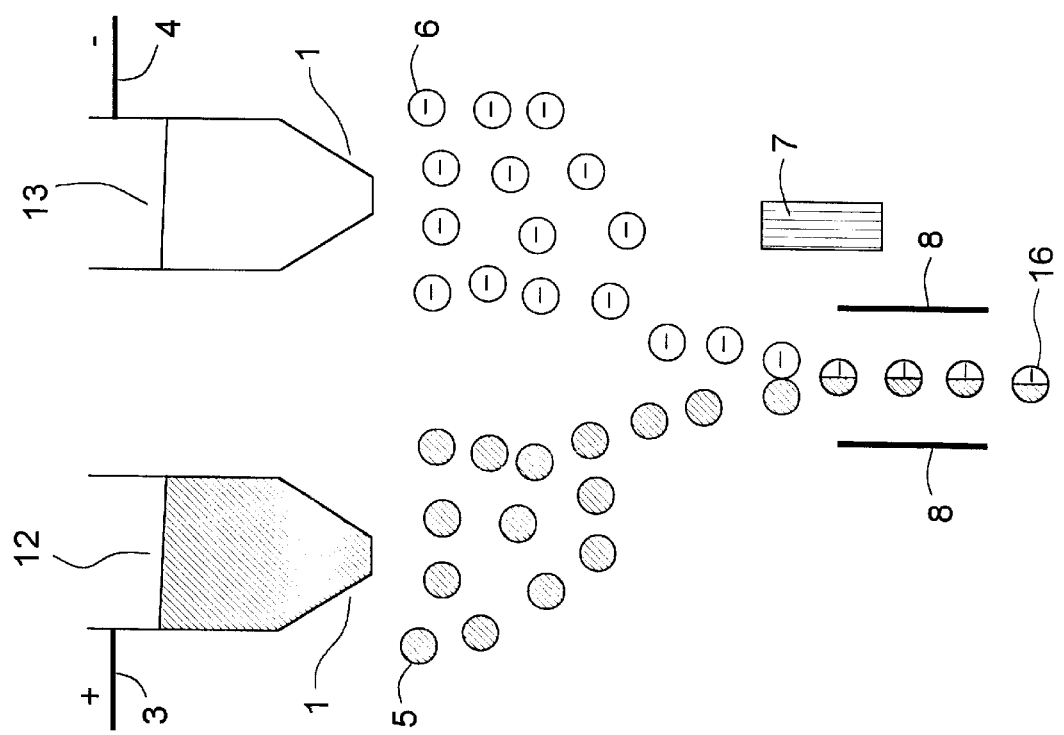

Referring to FIG. 1A atomizing nozzles 1 are loaded with materials 12 and 13 which may be differently colored. A first atomizing nozzle may be held at a positive potential 3 and a second nozzle may be held at a negative potential 4. Such potentials aid in atomization and impart a charge to droplets which form from said nozzles producing positively charge droplets 5 and negatively charged droplets 6. Such opposite charged droplets are attracted to each other electrostatically forming an overall neutral pair. After the formation of a neutral particle there is no more electrostatic attraction and no additional droplets are attracted to the neutral pair. If said material 12 and 13 is such that the particles are liquid when exiting said nozzles and either cool to form a solid or undergo a chemical reaction which may involve an additional hardening agent to form a solid then said charge may be trapped on each side of said neutral pair forming a bichromal solid particle with an implanted dipole 16. By suitable choice of materials such as polyethylene, polyvinylidene fluoride or other materials such metastable dipoles may persist for long periods of time as is known in the art of electrets. A heating element 7 may serve to reheat said pair thus minimizing surface tension energy and serving to reform said pair into a more perfect spherical shape. Finally a set of electrodes 8 biased at either the same or opposite voltage may be employed to trap particles which are not overall charge neutral.

Referring to FIG. 1B a similar apparatus may be employed to create a monochromal particle with an implanted dipole. In this arrangement nozzles containing material of the same color 12 are employed as before to create a monochromal particle with implanted dipole 21.

Figure 1C:
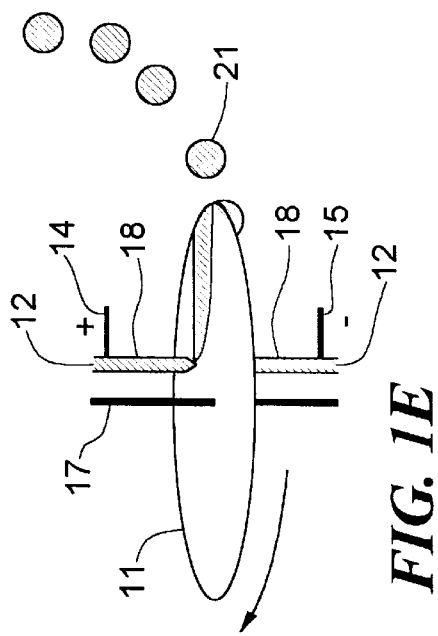
Figure 1D:
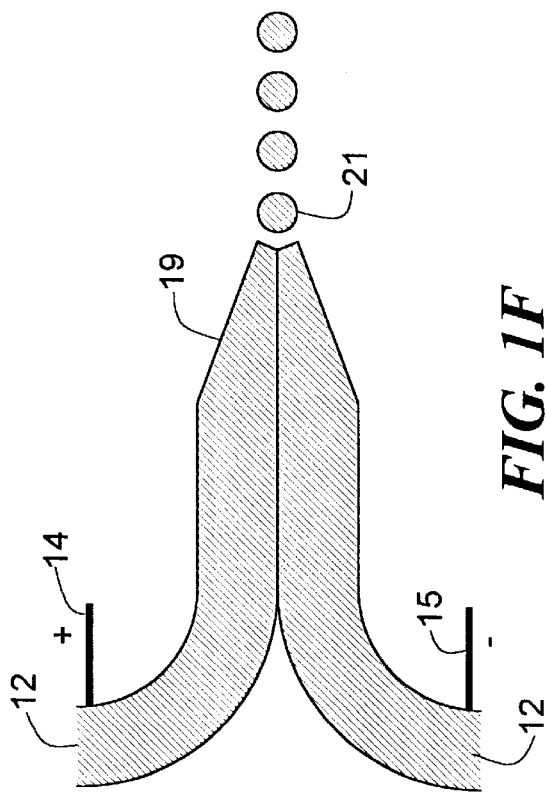

Referring to FIGS. 1C and 1D alternative means are shown for producing a bichromal particle with implanted dipole by means of combining two differentially colored materials 12 and 13 on a spinning disk 11 or in a double barreled nozzle 19. Said materials are charged by means of positive electrode 14 and negative electrode 15 and combine by means of electrostatic attraction at the rim of said disk or exit of said double barrel nozzle to form bichromal particle with implanted dipole moment 16. Said means differs from that known in the art by means of causing said two different materials 12 and 13 to coalesce by means of electrostatic attraction as opposed to relying on surface properties and interactions between the two materials. Additionally the present scheme creates a particle with an implanted dipole moment 16 which may serve to create a larger dipole moment than that possible from the naturally occurring Zeta potential.

Figure 1E:
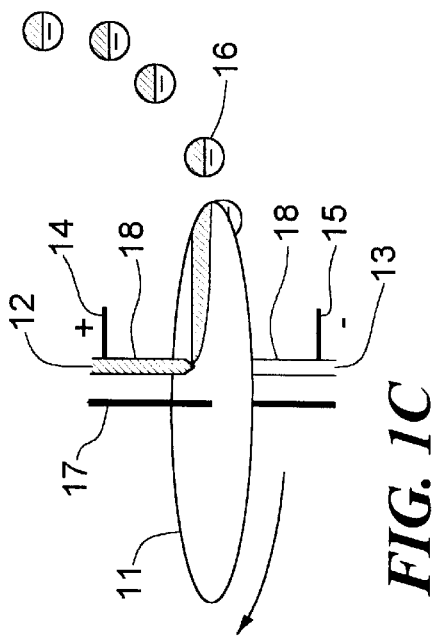
Figure 1F:
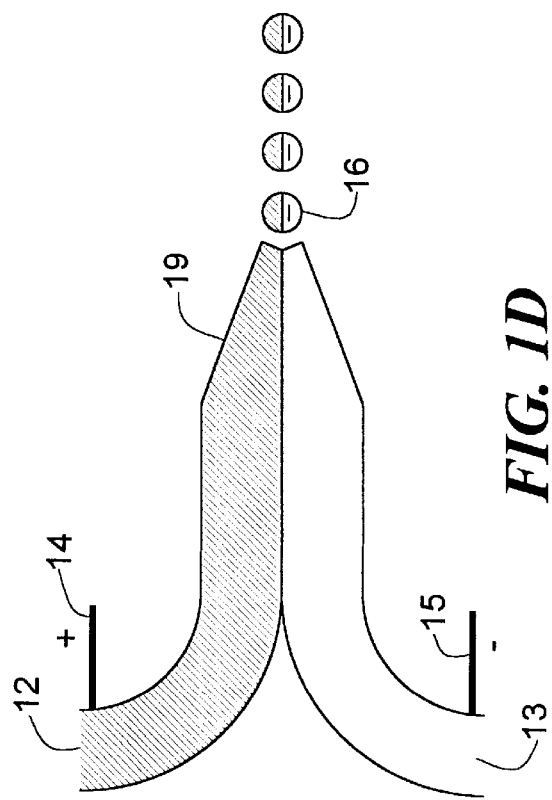

Referring to FIGS. 1E and 1F a similar apparatus may be employed to create a monochromal particle with an implanted dipole. In this arrangement nozzles containing material of the same color 12 are employed as before to create a monochromal particle with implanted dipole 21.

A large number of techniques are known in the literature for microencapsulating one material inside another material. Such techniques are generally used in the paper or pharmaceutical industry and do not generally produce a microcapsule which embodies simultaneously the properties of optical clarity, high dielectric strength, impermeability and resistance to pressure. With proper modification however these techniques may be made amenable to microencapsulating systems with electronic properties.

Referring to FIG. 2A an internal phase 25 which may be a liquid or may be a solid with an additional associated surface layer 27. Said internal phase if liquid or said associated surface layer may contain a polymer building block, such as adipoyl chloride in Silicone Oil. Said internal phase, with associated boundary layer in the case of a liquid, may then be dispersed in a continuous phase liquid 30 which may be an aqueous solution which is immiscible with said internal phase or associated surface layer. Finally a solution 40 which contains another polymer building block or cross linking agent may be added to continuous phase liquid 30. Said solution 40 has the effect of forming a solid layer at the interface of the internal phase or associated surface layer and said continuous phase liquid 30 thus acting to microencapsulate said internal phase.

Referring to FIG. 2B an internal phase 25 which may be a solid or a liquid may be caused to pass through a series of liquid films 50,60,70 which may contain polymer building blocks, cross linking agents and overcoat materials such that a final microcapsule 120 results comprised of an internal phase 25, an associated surface layer 27 and an outer shell 80.

An alternate means of microencapsulation is shown in FIG. 2C. In this scheme a light source 82 which may be a UV light source passes in some areas through a photomask 84 exposing a crosslinkable polymer which may be caused to form a cellular structure 86. The individual cells of said cellular structure may then be filled with an internal phase 25.

Figure 3A:
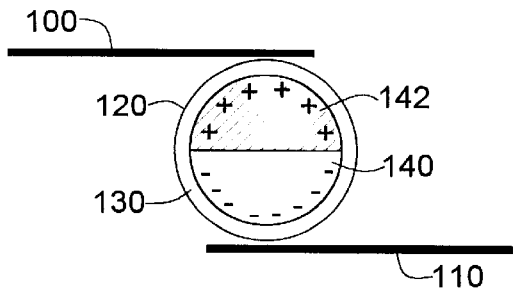
FIGS. 3A, 3B, 3C, 3D, and 3E are schematic representations of microencapsulated electronically addressable contrast media systems suitable for top to bottom addressing.

Employing the systems described in FIGS. 2A–C it is possible to microencapsulate systems with electronically active properties specifically electronically addressable contrast media. FIG. 3 details such electronically addressable contrast media systems which are suitable for addressing by means of a top clear electrode 100 and bottom electrode 110. Referring to FIG. 3A a microcapsule 120 may contain a microsphere with a positively charged hemisphere 142 and a negatively charged 140 hemisphere and an associated surface layer material 130. If said hemispheres are differentially colored an electric field applied to said electrodes may act to change the orientation of said sphere thus causing a perceived change in color.

Figure 3B:
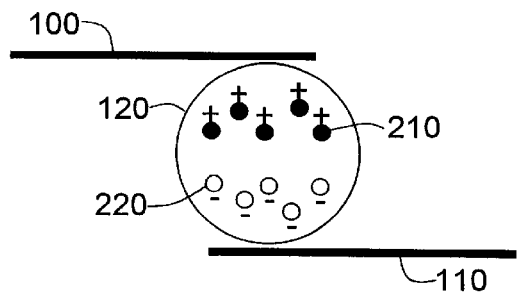

Referring to FIG. 3B a microcapsule 120 may contain positively charged particles of one color 210 and negatively charged particles of another color 220 such that application of an electric field to said electrodes causes a migration of the one color or the other color, depending on the polarity of the field, toward the surface of said microcapsule and thus effecting a perceived color change. Such a system constitutes a microencapsulated electrophoretic system.

Figure 3C:
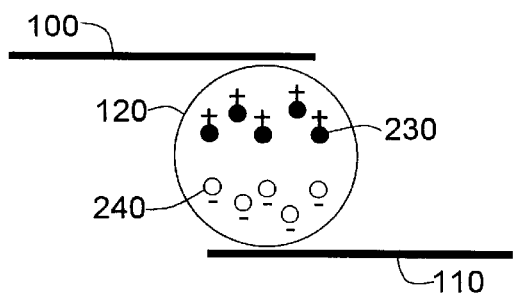
Figure 3D:
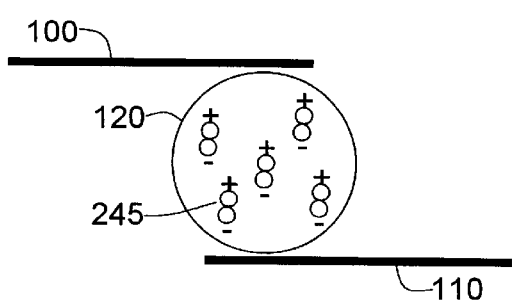

Referring to FIGS. 3C–D a microcapsule 120 may contain a dye, dye precursor or dye indicator material of a given charge polarity 230 or a dye, dye precursor or dye indicator material attached to a particle of given charge polarity such as a microsphere with an appropriate surface group attached and a reducing, oxidizing, proton donating, proton absorbing or solvent agent of the other charge polarity 240 or a reducing, oxidizing, proton donating, proton absorbing or solvent agent attached to a particle of the other charge polarity. Under application of an electric field said dye substance 230 is maintained distal to said reducing, oxidizing, proton donating, proton absorbing or solvent agent 240 thus effecting one color state as in FIG. 3C. Upon de-application of said electric field said dye substance and said reducing, oxidizing, proton donating, proton absorbing or solvent agent may bond to form a complex 245 of second color state. Suitable materials for use in this system are leuco and lactone dye systems and other ring structures which may go from a state of one color to a state of a second color upon application of a reducing, oxidizing or solvent agent or dye indicator systems which may go from a state of one color to a state of a second color upon application of a proton donating or proton absorbing agent as is known in the art. An additional gel or polymer material may be added to the contents of said microcapsule in order to effect a bistability of the system such that said constituents are relatively immobile except on application of an electric field.

Figure 3E:
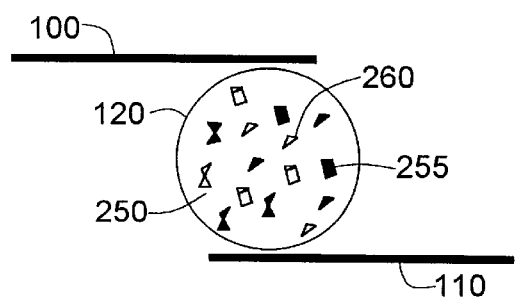

Referring to FIG. 3E a microcapsule 120 may contain phosphor particle 255 and photoconductive semiconductor particles and dye indicator particles 260 in a suitable binder 250. Applying an AC electric field to electrodes 100 and 110 causes AC electroluminescence which causes free charge to be generated in the semiconducting material further causing said dye indicator to change color state.

Figure 4A:
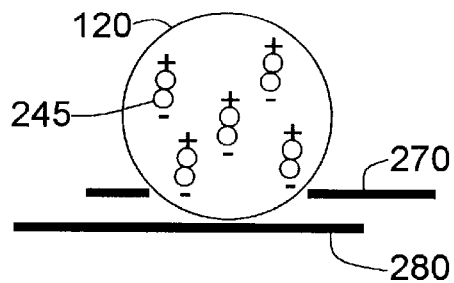
FIGS. 4A, 4B, 4C, 4D, 4E, 4F, 4G, 4H, 4I, 4J, 4K, 4L, and 4M are schematic representations of microencapsulated electronically addressable contrast media systems suitable for bottom addressing.
Figure 4B:
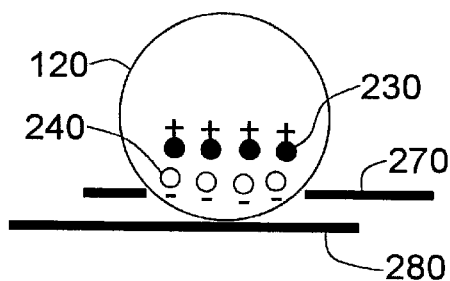

Referring to FIGS. 4A–M it may be desirable to develop ink systems which are suitable for use without a top transparent electrode 100 which may degrade the optical characteristics of the device. Referring to FIGS. 4A and B the chemistry as described in reference to FIGS. 3C–D may be employed with in-plane electrodes such that said chemistry undergoes a color switch from one color state to a second color state upon application of an electric field to in-plane electrodes 270 and 280. Such a system is viewed from above and thus said electrodes may be opaque and do not effect the optical characteristics of said display.

Figure 4C:
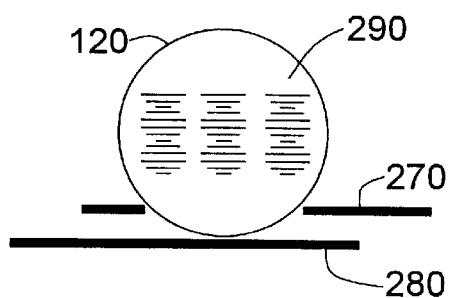
Figure 4D:
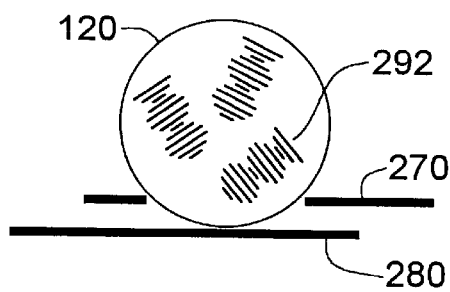

As another system in-plane switching techniques have been employed in transmissive LCD displays for another purpose, namely to increase viewing angle of such displays. Referring to FIGS. 4C and 4D a bistable liquid crystal system of the type demonstrated by Hatano et. al. of Minolta Corp. is modified to be effected by in plane electrodes such that a liquid crystal mixture transforms from a first transparent planar structure 290 to a second scattering focal conic structure 292.

Figure 4E:
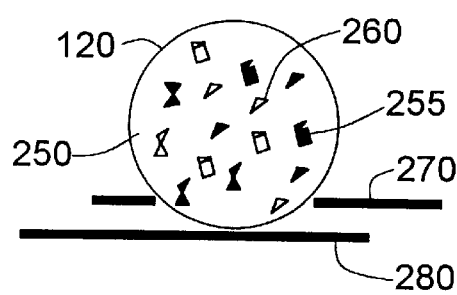

Referring to FIG. 4E the system of FIG. 3E may be switched by use of in-plane electrodes 270 and 280.

Figure 4F:
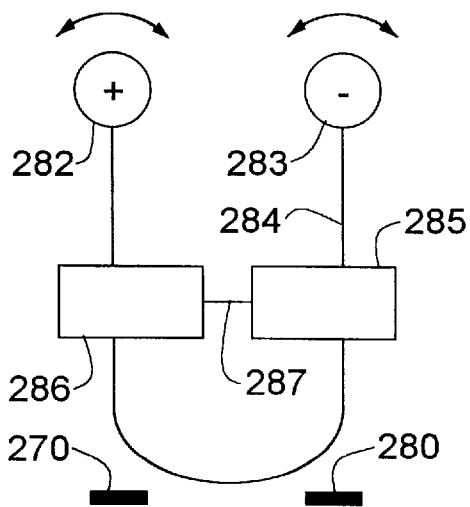
Figure 4H:
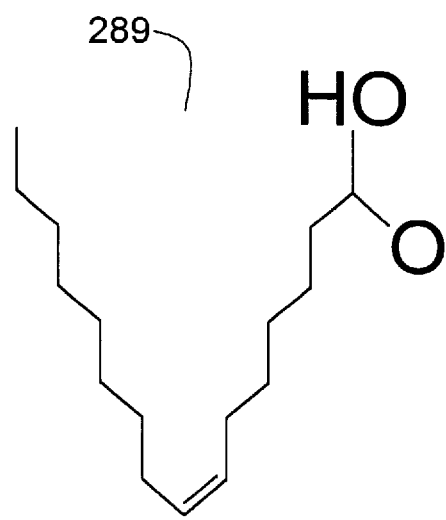
Figure 4G:
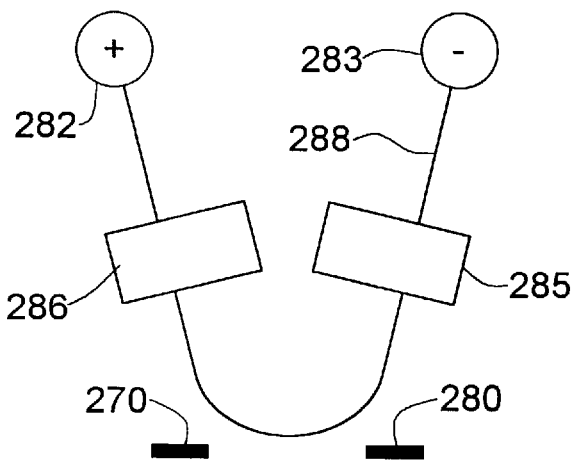

Other systems may be created which cause a first color change by means of applying an AC field and a second color change by means of application of either a DC field or an AC field of another frequency. Referring to FIGS. 4F–G a hairpin shaped molecule or spring in the closed state 284 may have attached to it a positively charged 282 and a negatively charged 283 head which may be microspheres with implanted dipoles. Additionally one side of said hairpin shaped molecule or spring has attached to it a leuco dye 286 and the other side of said hairpin shaped molecule or spring has attached to it a reducing agent 285. When said molecule or spring is in the closed state 284 then said leuco dye 286 and said reducing agent 285 are brought into proximity such that a bond is formed 287 and said leuco dye is effectively reduced thus effecting a first color state. Upon a applying an AC electric field with frequency that is resonant with the vibrational mode of said charged heads cantilevered on said hairpin shaped molecule or spring said bond 287 may be made to break thus yielding an open state 288. In said open state the leuco dye and reducing agent are no longer proximal and the leuco dye, being in a non-reduced state, effects a second color state. The system may be reversed by applying a DC electric field which serves to reproximate the leuco dye and reducing agent groups. Many molecules or microfabricated structures may serve as the normally open hairpin shaped molecule or spring. These may include oleic acid like molecules 289. Reducing agents may include sodium dithionite. We note that the system as discussed is bistable. We note also that energy may be stored in said hairpin shaped molecule or spring and as such said system may also function as a battery.

Figure 4I:
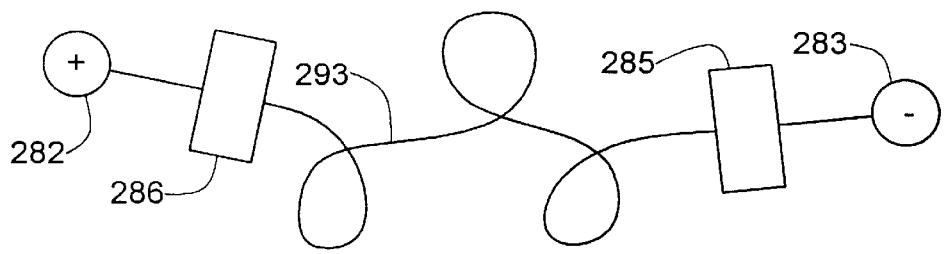
Figure 4J:
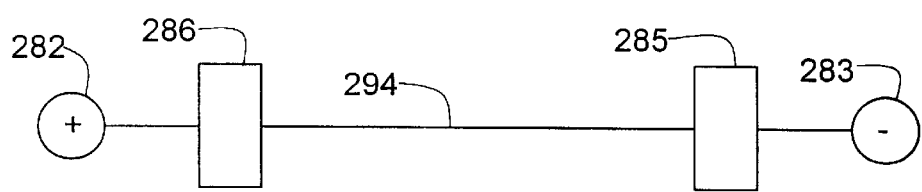
Figure 4K:
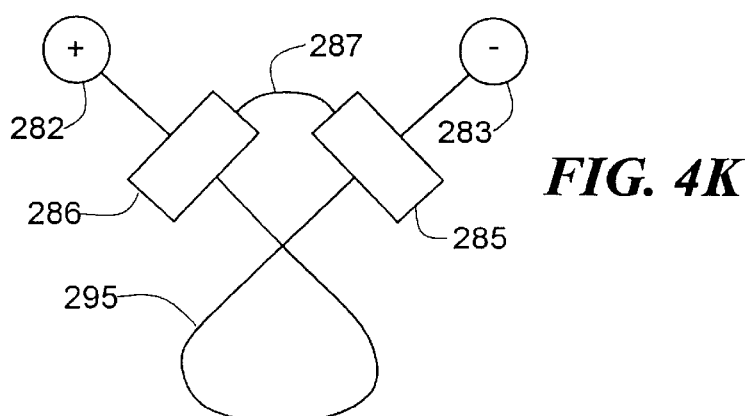

Referring to FIGS. 4I–K an alternative leucodye-reducing agent system may employ a polymer shown in FIG. 4I in a natural state 293. When a DC electric field is applied said polymer assumes a linear shape 294 with leuco 286 and reducing agent 285 groups distal from each other. Upon application of either a reversing DC field or an AC electric field said polymer will tend to coil bringing into random contact said leuco and reducing groups forming a bond 287 with a corresponding color change. Said polymer serves to make said system bistable.

Figure 4L:
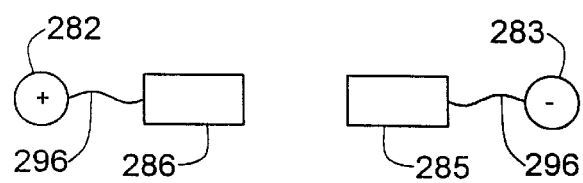
Figure 4M:
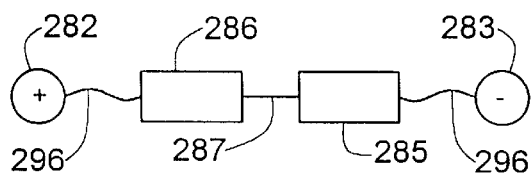

Referring to FIGS. 4L and 4M a similar system is possible but instead polymer leuco and reducing groups may be attached to oppositely charge microspheres directly by means of a bridge 286 which may be a biotin-streptavidin bridge, polymer bridge or any other suitable bridge. As before application of a DC field cause leuco and reducing groups to become distal whereas application of a reverse DC field or AC field brings into random contact the leuco and reducing groups. A polymer may be added to aid in the stability of the oxidized state.

Referring to FIGS. 5A–D and FIGS. 6A–B an entirely different principle may be employed in an electronically addressable contrast media ink. In these systems the dielectrophoretic effect is employed in which a species of higher dielectric constant may be caused to move to a region of high electric field strength.

Figure 5A:
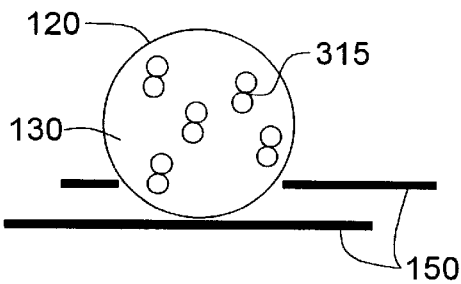
FIGS. 5A, 5B, 5C, and 5D are schematic representations of microencapsulated electronically addressable contrast media systems based on a dielectrophoretic effect.
Figure 5B:
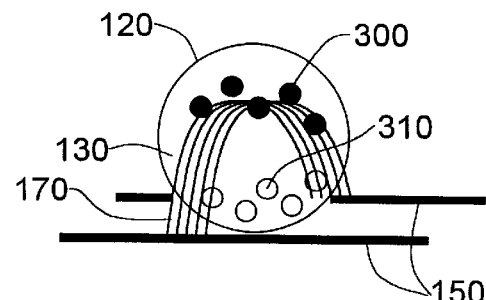

Referring to FIGS. 5A and 5B a non-colored dye solvent complex 315 which is stable when no field is applied across electrode pair 150 may be caused to become dissociate into colored dye 300 and solvent 310 components by means of an electric field 170 acting differentially on the dielectric constant of said dye complex and said solvent complex as applied by electrode pair 150. It is understood that the chemistries as discussed in the system of FIGS. 3C–D may readily be employed here and that said dye complex and said solvent complex need not themselves have substantially different dielectric constants but rather may be associated with other molecules or particles such as microspheres with substantially different dielectric constants. Finally it is understood that a gel or polymer complex may be added to the contents of said microcapsule in order to effect a bistability.

Figure 5C:
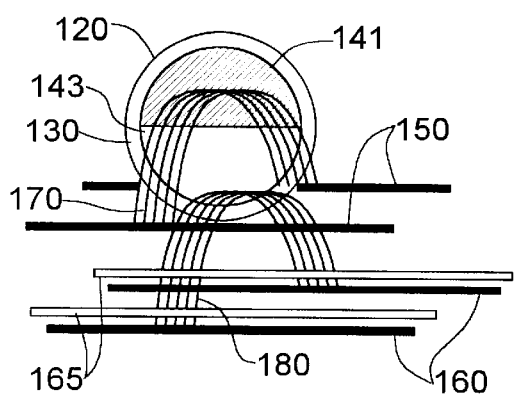
Figure 5D:
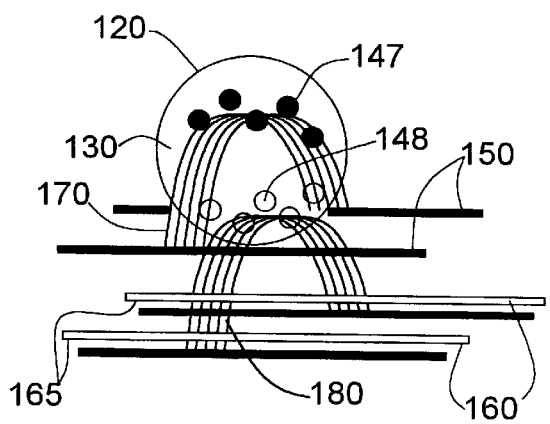

Referring to FIGS. 5C–D stacked electrode pairs 150 and 160 may be employed to effect a high electric field region in a higher 170 or lower 180 plane thus causing a higher dielectric constant material such as one hemisphere of a bichromal microsphere 141 or one species of a mixture of colored species 147 to migrate to a higher or lower plane respectively and give the effect of differing color states. In such schemes materials 165 which may be dielectric materials or may be conducting materials may be employed to shape said electric fields.

Figure 6A:
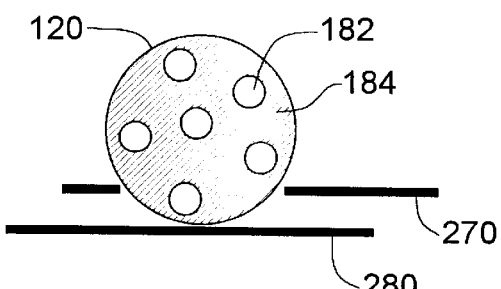
FIGS. 6A and 6B are schematic representations of microencapsulated electronically addressable contrast media systems based on a frequency dependent dielectrophoretic effect.
Figure 6B:
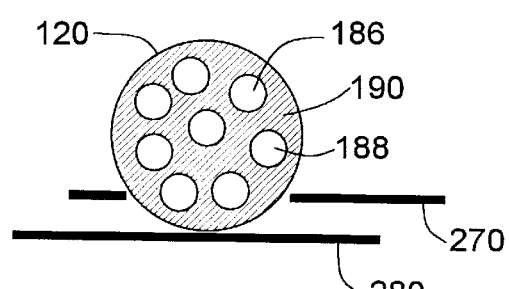

Referring to FIGS. 6A–B, systems based on a frequency dependent dielectrophoretic effect are described. Such systems are addressed by means of applying a field of one frequency to produce a given color and applying a field of a different frequency to produce another color. Such a functionality allows for a rear addressed display.

Figure 6C:
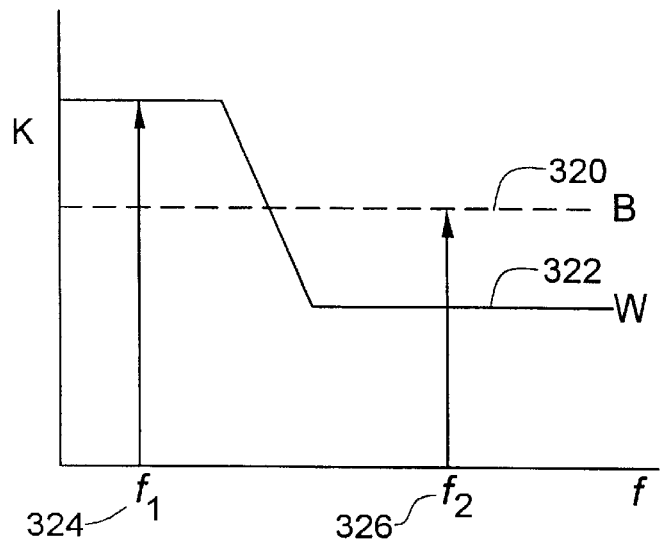
FIGS. 6C, 6D, and 6E are plots of the dielectric parameter as a function of frequency for various physical systems.

Referring to FIG. 6A, a microcapsule 120 encompasses an internal phase 184 which may be a material which has a frequency independent dielectric constant as shown in Plot 6C, curve 320 and which may have a first color B and material 182 which has a frequency dependent dielectric constant and a second color W. Said frequency dependent material may further have a high dielectric constant at low frequency and a smaller dielectric constant at higher frequency as shown in FIG. 6C 322. Application of a low frequency AC field by means of electrodes 270 and 280 causes said material 182 to be attracted to the high field region proximal to the electrodes thus causing said microcapsule to appear as the color B when viewed from above. Conversely application of a high frequency AC field by means of electrodes 270 and 280 causes said material 184 to be attracted to the high field region proximal the electrodes thus displacing material 182 and thus causing said microcapsule to appear as the color W when viewed from above. If B and W correspond to Black and White then a black and white display may be effected. A polymer material may be added to internal phase 184 to cause said system to be bistable in the field off condition. Alternatively stiction to the internal side wall of said capsule may cause bistability.

Referring to FIG. 6A, material 182 and FIG. 6C, a particle is fabricated with an engineered frequency dependent dielectric constant. The means for fabricating this particle are depicted in FIGS. 1B, E and F. At low frequency such dipolar particles have sufficiently small mass that they may rotate in phase with said AC field thus effectively canceling said field and acting as a high dielectric constant material. At high frequency however the inertia of said particles is such that they cannot keep in phase with said AC field and thus fail to cancel said field and consequently have an effectively small dielectric constant.

Alternatively material 182 may be comprised of naturally occurring frequency dependent dielectric materials. Materials which obey a frequency dependence functionality similar to the artificially created dipole material discussed above and which follow curves similar to FIG. 6C, curve 322 include materials such as Hevea rubber compound which has a dielectric constant of K=36 at $f=10^3$ Hz and K=9 at $f=10^6$ Hz, materials with ohmic loss as are known in Electromechanics of Particles by T. B. Jones incorporated herein by reference and macromolecules with permanent dipole moments.

Figure 6D:
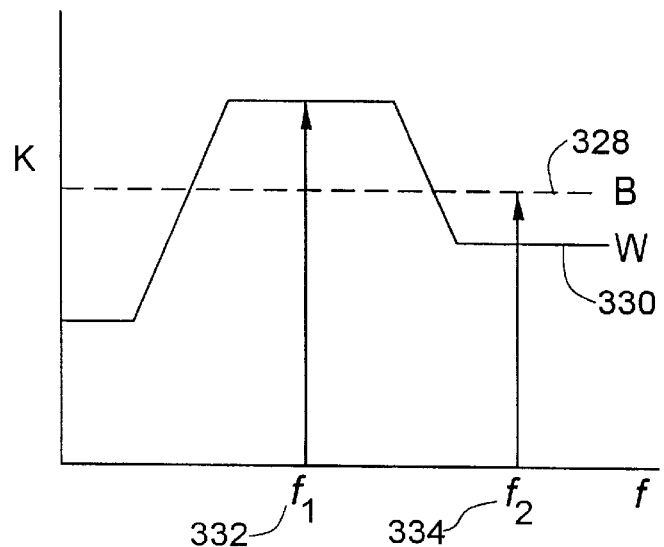

Additionally material 182 may be a natural or artificial cell material which has a dielectric constant frequency dependence as depicted in FIG. 6D, curve 330 as are discussed in Electromechanics of Particles by T. B. Jones incorporated herein by reference. Such particles are further suitable for fabrication of an electronically addressable contrast ink.

Figure 6E:
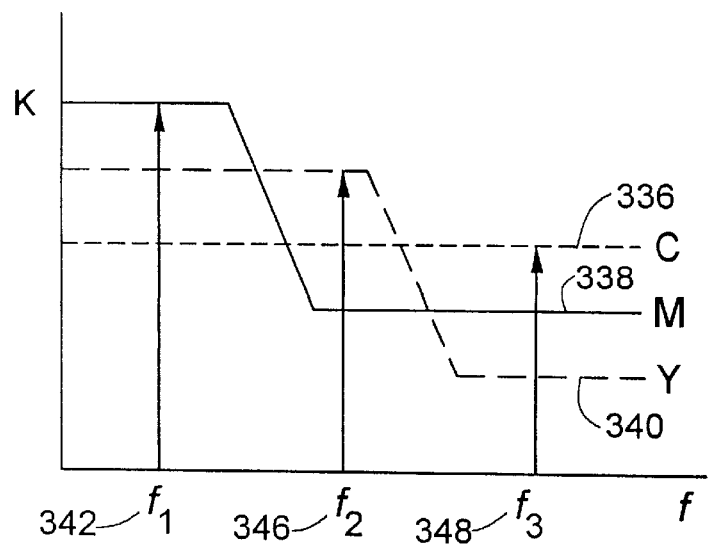
Figure 7A:
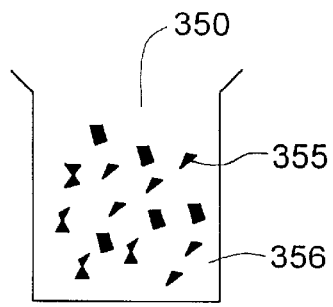
FIGS. 7A, 7B, 7C, and 7D are schematic representations of electronic ink systems and means for printing the same.
Figure 7C:
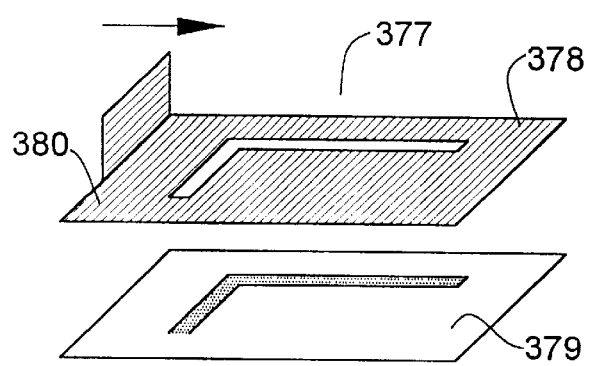
Figure 7B:
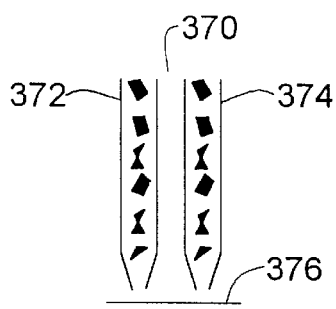
Figure 7D:
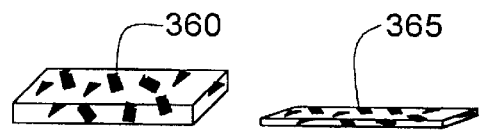

Referring to FIG. 6B a system is depicted capable of effecting a color display. Microcapsule 120 contains a particle of a first dielectric constant, conductivity and color 186, a particle of a second dielectric constant, conductivity and color and an internal phase of a third dielectric constant, conductivity and color 190. Referring to FIG. 6E it is known in the art of electromechanics of particles that for particles with ohmic loss (e.g. finite conductivity) that at low frequency the DC conductivity governs the dielectric constant whereas at high frequency the dielectric polarization governs the dielectric constant. Thus a particle with finite conductivity has a dielectric constant K as a function of frequency f as in FIG. 6E, curve 338. A second particle of second color has a dielectric constant K as a function of frequency f as in FIG. 6E, curve 340. Finally an internal phase with no conductivity has a frequency independent dielectric constant K, curve 336. If an AC field of frequency f1 is applied by means of electrodes 270 and 280, material 186 of color M will be attracted to the high field region proximal to said electrodes thus causing said microcapsule to appear as a mixture of the colors C and Y, due to the other particle and internal phase respectively, when viewed from above. If an AC field of frequency f2 is applied by means of electrodes 270 and 280 material 188 of color Y will be attracted to the high field region proximal to said electrodes thus causing said microcapsule to appear as a mixture of the colors C and M when viewed from above. Finally if an AC field of frequency f3 is applied by means of electrodes 270 and 280 internal phase 190 of color C will be attracted to the high field region proximal to said electrodes thus causing said microcapsule to appear as a mixture of the colors M and Y when viewed from above. If C, M and Y correspond to Cyan, Magenta and Yellow a color display may be effected.

It is understood that many other combinations of particles with frequency dependent dielectric constants arising from the physical processes discussed above may be employed to effect a frequency dependent electronically addressable display.

In addition to the microencapsulated electronically addressable contrast media ink discussed in FIGS. 3–6, FIGS. 7–9 depict other types of electronically active ink systems. In the prior art means are known for depositing metals or resistive materials in a binding medium which may later be cured to form conducting or resistive traces. In the following description novel means are described for depositing semiconductive materials in a binder on a large class of substrate materials in one case and for depositing metals, resistive materials or semiconductive materials outside of vacuum, in an arbitrary pattern, without the need for an etch step and on a large class of substrate materials in another case.

In one system a semiconductor ink 350 may be fabricated by dispersing a semiconductor powder 355 in a suitable binder 356. Said semiconductive powder may be Si, Germanium or GaAs or other suitable semiconductor and may further be with n-type impurities such as phosphorus, antimony or arsenic or p-type impurities such as boron, gallium, indium or aluminum or other suitable n or p type dopants as is known in the art of semiconductor fabrication. Said binder 356 may be a vinyl, plastic heat curable or UV curable material or other suitable binder as is known in the art of conducting inks. Said semiconductive ink 350 may be applied by printing techniques to form switch or logic structures. Said printing techniques may include a fluid delivery system 370 in which one or more inks 372, 374 may be printed in a desired pattern on to a substrate. Alternatively said ink system 350 may be printed by means of a screen process 377 in which an ink 380 is forced through a patterned aperture mask 378 onto a substrate 379 to form a desired pattern. Said ink pattern 360 when cured brings into proximity said semiconductive powder particles 355 to create a continuous percolated structure with semiconductive properties 365.

Figure 8:
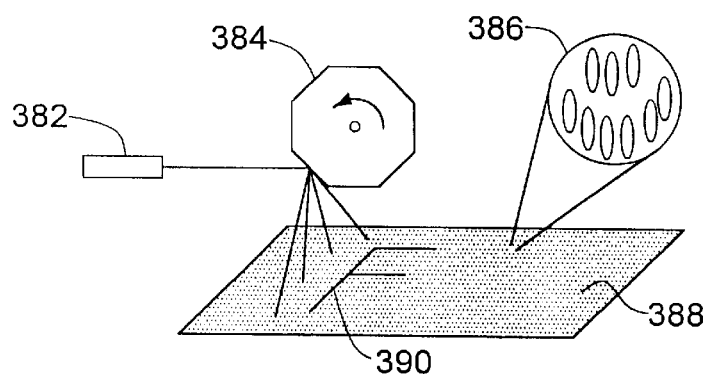
FIG. 8 is a schematic representation of a laser reduced metal salt ink system.

Referring to FIG. 8 a system is depicted for causing a conductive or semiconductive trace 390 to be formed on substrate 388 in correspondence to an impinging light source 382 which may be steered by means of an optical beam steerer 384. The operation of said system is based upon a microcapsule 386 which contains a metal or semiconductive salt in solution. Upon being exposed to light 382 which may be a UV light said metal or semiconductive salt is reduced to a metal or semiconductor and said microcapsule is simultaneously burst causing deposition of a conductive or semiconductive trace.

Referring to FIG. 9A an ink jet system for depositing metallic or semiconductive traces 410 is depicted. In this system a jet containing a metal or semiconductive salt 420 impinges upon a substrate 400 in conjunction with a jet containing a reducing agent 430. As an example, to form a metallic trace silver nitrate (AgNO3) may be used for jet 420 and a suitable aldehyde may be used for the reducing jet 430. Many other examples of chemistries suitable for the present system are known in the art of electroless plating. In all such examples it is understood that said jets are moveable and controllable such that an arbitrary trace may be printed.

Referring to FIG. 9B a system which is similar to that of FIG. 9A is depicted. In this case an electron beam 470 may be used instead of said reducing jet in order to bring about a reduction of a metal or semiconductive salt emanating from a jet 460. A ground plane 450 may be employed to ground said electron beam.

Referring to FIG. 9C an ink jet system for depositing a metallic or semiconductive trace is depicted based on electroplating. In this system a metal or semiconductive salt in a jet 480 held at a potential V may be electroplated onto a substrate 410 thus forming a metallic or semiconductive trace.

Referring to FIG. 9D means are known in the prior art for UV reduction of a metal salt from an ink jet head. In the present system a jet containing a metal or semiconductive salt 490 may be incident upon a substrate 400 in conjunction with a directed light beam 495 such that said metal or semiconductive salt is reduced into a conductive or semiconductive trace 410. Alternatively jet 490 may contain a photoconductive material and a metal salt which may be caused to be photoconductively electroplated onto surface 400 by means of application of light source 495 as is known in the field of photoconductive electroplating.

Figure 9E:
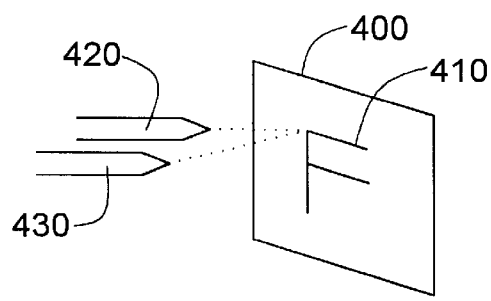
Figure 9E:
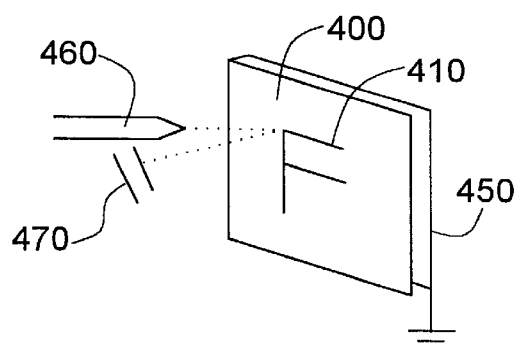
Figure 9E:
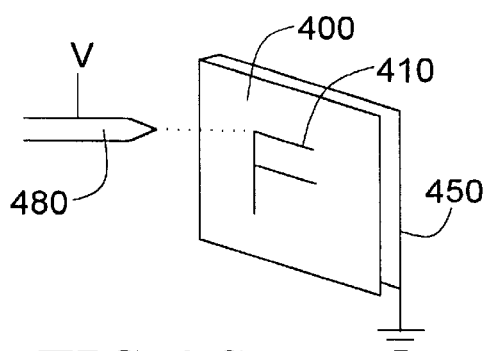
Figure 9E:
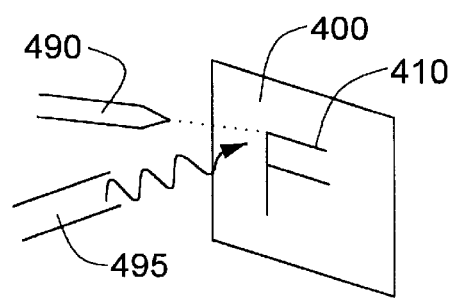
Figure 9E:
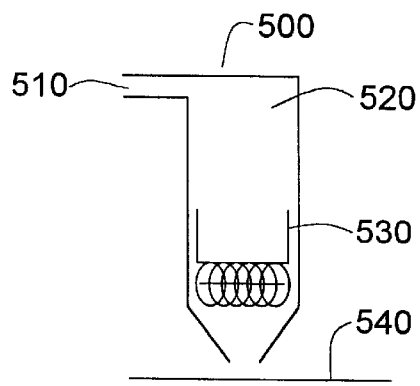

Referring to FIG. 9E a system is depicted for a moveable deposition head 500 which contains a chamber 520 which may be filled with an inert gas via inlet 510 and which further contains thermal, sputtering, electron beam or other deposition means 530. Said moveable head 500 may print a metal, semiconductor, insulator, spin material or other material in an arbitrary pattern onto a large class of substrates 540. In some case such substrate 540 be cooled or chilled to prevent damage from said materials which may be at an elevated temperature.

Referring to FIG. 10 said previously described electronically active ink systems and printing means may be applied to form switch or logic structures, optoelectronic structures or structures useful in radio or magnetic or electric field transmission of signals or power. As indicated in FIGS. 10A–B an NPN junction transistor may be fabricated consisting of a n-type emitter 950, a p-type base 954 and a n-type collector 952.

Alternatively a field effect transistor may be printed such as a metal oxide semiconductor. Such a transistor consists of a p-type material 970, an n-type material 966 an n-type inversion layer 968 an oxide layer 962 which acts as the gate a source lead 960 and a drain lead 964. It is readily understood that multiple layers of logic may be printed by using an appropriate insulating layer between said logic layers. Further three dimensional interconnects between different logic layers may be accomplished by means of vias in said insulating layers.

Figure 10A:
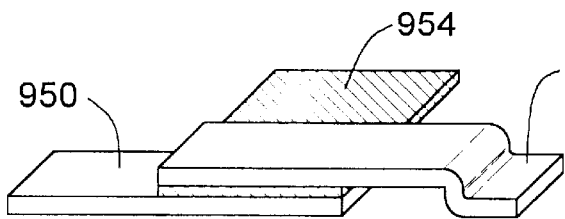
FIGS. 10A, 10B, and 10C are schematic diagrams of printed transistor structures.
Figure 10B:
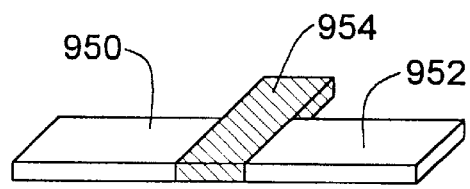
Figure 10C:
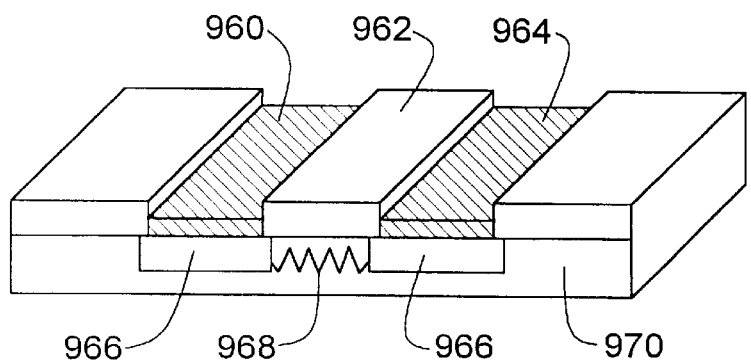
Figure 10D:
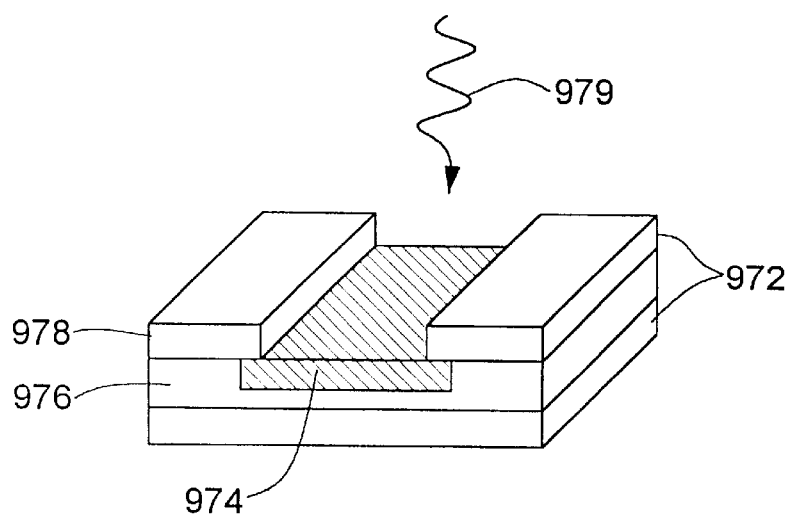
FIG. 10D is a schematic diagram of a printed optoelectronic element.

Referring to FIG. 10D a printed solar cell may be fabricated by printing some or all of a metal contact layer 972, a p-type layer 974, an n type layer 976 and an insulating layer 978. Light 979 which impinges upon said structure generates a current as is known in the art of solar cells. Such printed solar cells may be useful in very thin compact and/or inexpensive structures where power is needed.

Figure 10E:
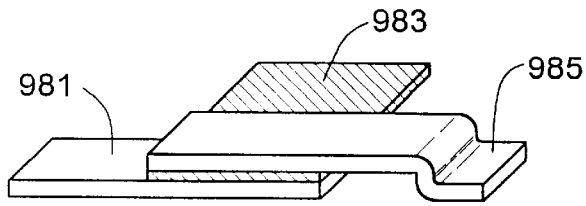

Referring to FIGS. 10E–H elements useful for analog circuitry maybe printed. Referring to FIG. 10E a capacitor may be printed with dielectric material 983 interposing capacitor plates 981 and 985. Alternatively the same structure may constitute a resistor by replacing dielectric 983 with a resistive material such as carbon ink.

Figure 10H:
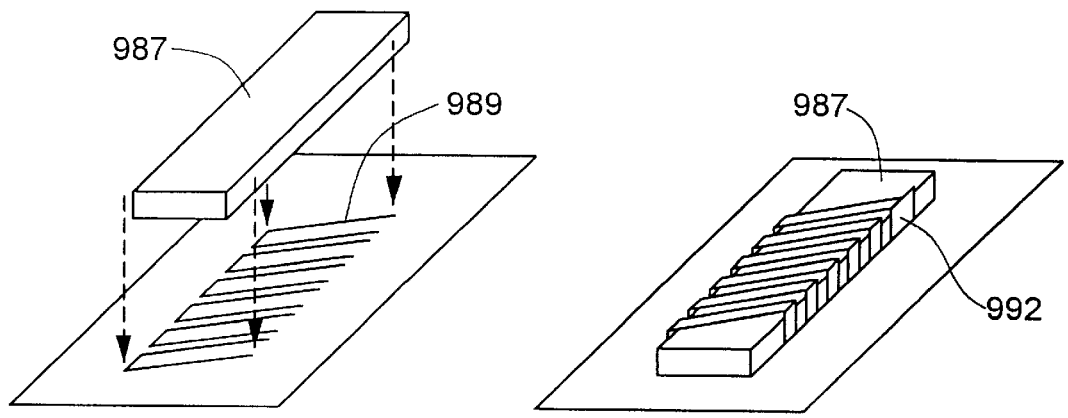
Figure 10H:
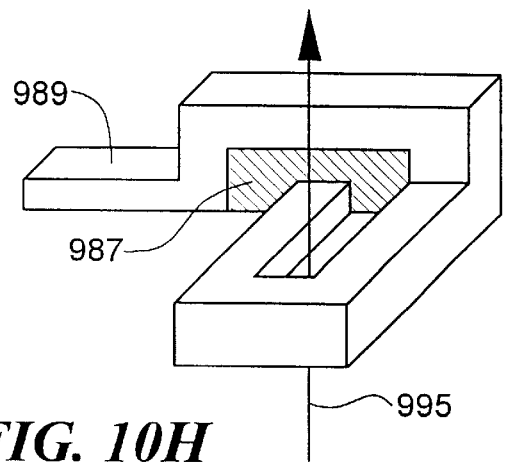

Referring to FIGS. 10F–H inductors, chokes or radio antennae may be printed layer by layer. Referring to FIGS. 10F and G a first set of diagonal electrodes 989 may be laid down on a substrate. On top of this may be printed an insulator or magnetic core 987. Finally top electrodes 992 which connect with said bottom electrodes may be printed this forming an inductor, choke or radio antennae. An alternate in plane structure is shown in FIG. 10H in which the flux field 995 is now perpendicular to the structure.

The ink systems and printing means discussed in the foregoing descriptions may be useful for the fabrication of a large class of electronically functional structures. FIGS. 11–14 depict a number of possible such structures which may be fabricated.

Figure 11A:
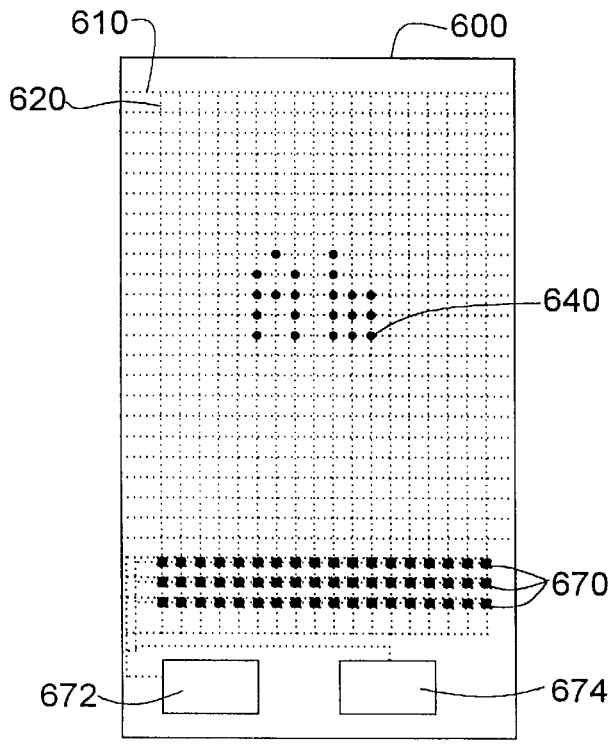
FIGS. 11A, 11B, and 11C are a schematic diagram of an electronic display employing printed elements; this display may further include a data receiver or transceiver and a power means.

Referring to FIG. 11A, an electronic display, similar to one described in a copending patent application, Ser. No. 08/504,896, filed Jul. 20, 1995 by Jacobson, is comprised of electronically addressable contrast media 640, address lines 610 and 620 and logic elements 670 all or some of which may be fabricated with the ink systems and printing means as described in the foregoing descriptions. Said Electronic Display may additionally comprise a data receiver or transceiver block 672 and a power block 674. Said data receiver block may further be a wireless radio receiver as pictured in FIG. 11B in which some or all of the components thereof including antennae 676, inductor or choke 678, diode, 680, capacitor 682, NPN transistor 684, resistor 681, conducting connection 677 or insulation overpass 675 may be printed by the means discussed above. Alternatively said data receiver or transceiver block may be an optelectronic structure, a magnetic inductive coil an electric inductive coupling or an acoustic transducer such as a piezoresistive film.

Figure 11C:
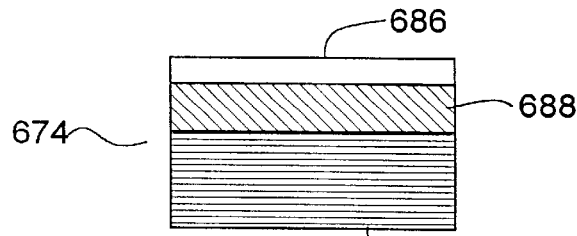
Figure 11B:
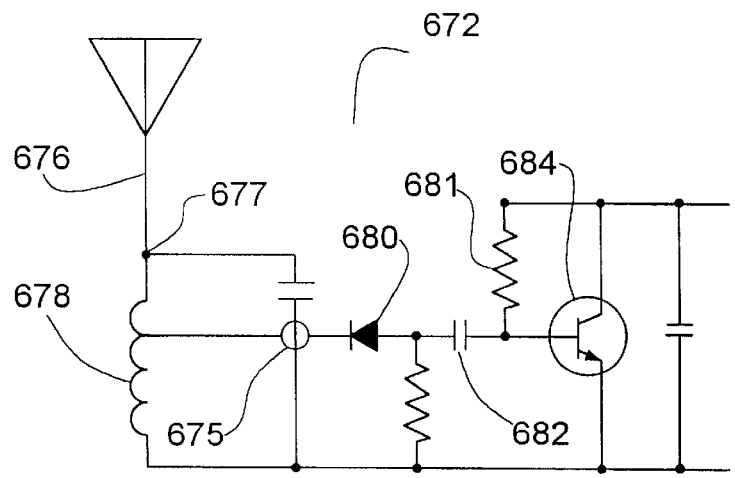

Said power block 674 may comprise a printed polymer battery as pictured in FIG. 11C which consists of in one instance a lithium film 686, a propylene carbonate $LiPF_6$ film 688 and $aLiCoO_2$ in matrix 690. Said power block may alternatively consist of any other battery structure as known in the art of thin structure batteries, a magnetic or electric inductive converter for means of power reception as known in the art, a solar cell which may be a printed solar cell or a semiconductive electrochemical cell which may further have an integral fuel cell for energy storage or a piezoelectric material which generates power when flexed.

Such a display 600 as described above further comprising a data receiver or transceiver 672 and power block 674 in which some or all of said components are printed may comprise an inexpensive, lightweight, flexible receiver for visual data and text which we may term "radio paper." In such a system data might be transmitted to the "radio paper" sheet and there displayed thus forming a completely novel type of newspaper, namely one which is continuously updated.

Figure 12:
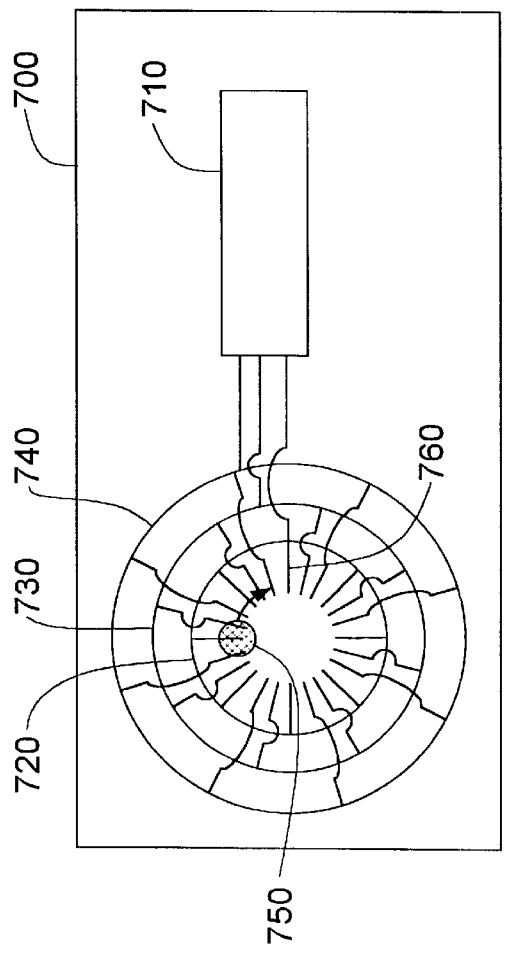
FIG. 12 is a schematic diagram of an electrostatic motor which may be in the form of a watch or clock in which said electrostatic elements are printed

Referring to FIG. 12 an electrostatic motor which may form an analog clock or watch is depicted which consists of printed conducting elements 720, 730, 740 and 760 which are printed onto substrate 700. Said elements, when caused to alternately switch between positive negative or neutral states by means of a logic control circuit 710 may cause an element 750 to be translated thus forming a motor or actuator. In the device of FIG. 12 some or all of said conducting elements and/or logic control elements may be printed using the ink systems and printing means described in the foregoing description.

Figure 13A:
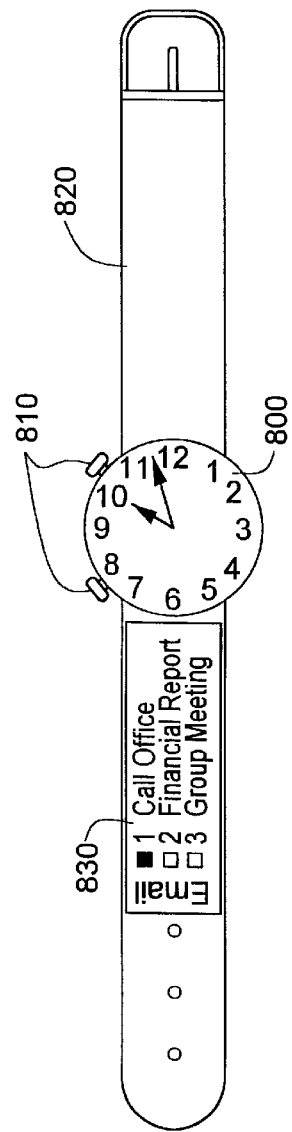
FIGS. 13A and 13B are a schematic diagram of a watch in which the wristband of said watch incorporates an electronically addressable display having printed elements and which may further comprise wireless means for sending or receiving data or power between watch and watchband.

Referring to FIG. 13A a wrist watch 800 is depicted in which the band 820 of said watch contains an electronically addressable display 830 in which some or all of the components of said display, including the electronically addressable contrast media, the address lines and/or the logic are fabricated by means of the ink systems and printing means described in the foregoing description. Such a fabrication may be useful in terms of producing an inexpensive, easily manufacturable and thin display function. Control buttons 810 may serve to control aspects of said display 830.

Figure 13B:
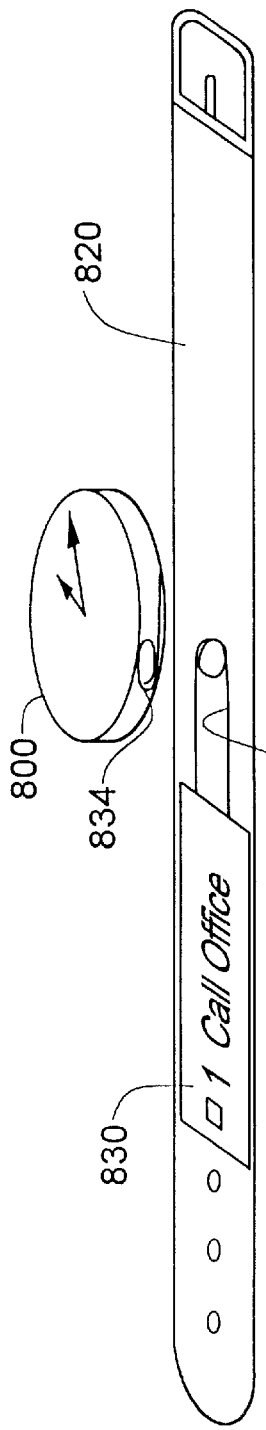

Referring to FIG. 13B it is presently a problem to transmit data or power to a watch band via a wire connection as such connections tend to become spoiled by means of motion of the watchband relative to the watch. In order to overcome this FIG. 13B describes a system in which a magnetic or electric inductor 832 in watch band 820 may receive or transmit power or data to a magnetic or electric inductor 834 in watch 800 thus eliminating said wired connection. Said inductor 832 and 834 may be printed structures.

Figure 14:
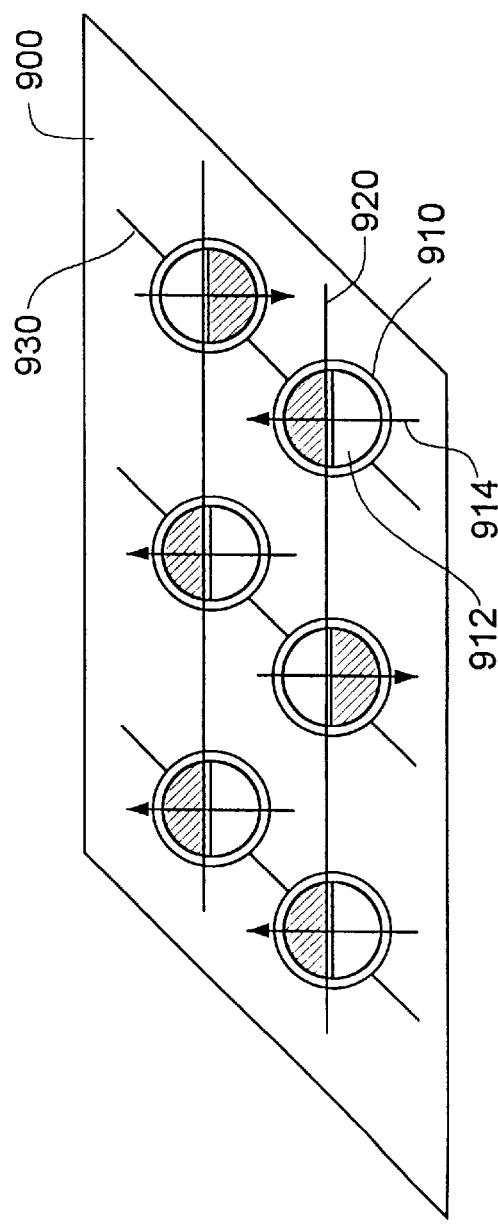
FIG. 14 is a schematic diagram of a spin computer.

Referring to FIG. 14, a spin computer is depicted in which dipoles 912 with dipole moment 914 are situated at the nodes of row 920 and column 930 address lines. Such a computer works by means of initially addressing said dipoles to an initial condition by said address lines and then allowing dipole interactions to produce a final state of the system as a whole thus performing a calculation as is known in the art of Spin Ising models and cellular automata. Said dipoles may consist of a dipolar microsphere 912 microencapsulated in a microcapsule 910 or may consist of another form of dipole and/or another means of encapsulation.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. An electrically addressable ink comprising a microcapsule, said microcapsule comprising:
   a first particle having a first charge; and
   a second particle having a second charge;
   wherein applying an electric field having a first polarity to said microcapsule effects a perceived optical property change by causing one of said first and second particles to migrate in a direction responsive to said field.

2. The ink of claim 1 wherein both said first and said second particles move in response to said electric field.

3. The ink of claim 1 wherein said first particle has a color.

4. The ink of claim 1 wherein said first particle comprises a dye.

5. The ink of claim 1 wherein the first particle further comprises a dye indicator system.

6. The ink of claim 1 wherein said microcapsule further comprises a material such that said first and second particles are substantially immobile in the absence of an electric field.

7. The ink of claim 1 wherein said second particle comprises a substance capable of reacting with said first particle, whereupon the application of a first electric field causes said first particle to be maintained separate from said substance such that said ink is maintained in a first color state; and whereupon application of a second electric field said first particle and said substance react to form a compound having a second color state.

8. The ink of claim 7 wherein said first particle and said substance react to form a compound having a color state when at least one of said first and second electric fields is zero.

9. The ink of claim 1 wherein said first particle comprises a ring structure coupled to a first head having a first charge, and said second particle comprises a substance coupled to a second head having a second charge;

wherein application of an electric field causes said ring structure and said substance to become separated from each other, effecting a first color state.

10. The ink of claim 9 wherein application of a second electric field brings said ring structure and said substance into contact to effect a second color state.

11. A microencapsulated ink system, comprising:

a microcapsule comprising:

a photoconductive semiconductor particle; and a dye indicator particle;

wherein the application of an electric field to said microcapsule causes said photoconductive semiconductor particle to generate free charge, causing the dye indicator to effect a first color state.

12. An electrically addressable ink comprising a microcapsule, said microcapsule comprising:

a hairpin-shaped molecule having a first portion and a second portion, said hair-pin shaped molecule comprising:

a first moiety having a first charge attached to said first portion of said hairpin-shaped molecule; and a second moiety having a second charge attached to said second portion of said hairpin-shaped molecule, said second moiety capable of reacting with said first moiety, said second charge being opposite to said first charge;

the reaction between said first moiety and said second moiety defining a closed state of said hairpin-shaped molecule effecting a first color state; and the separation of said first moiety from said second moiety defining an open state of said hairpin-shaped molecule, effecting a second color state.

13. The ink of claim 12 wherein said hairpin-shaped molecule transitions between open and closed states upon application of an electric field.

14. The ink of claim 13 wherein said hairpin-shaped molecule transitions between open and closed states upon application of an alternating field having a frequency resonant with the vibrational mode of the first and second moieties.

15. An electronically addressable ink comprising a microcapsule, said microcapsule comprising:

a polymer molecule having a first non-linear shape in the presence of a first electric field, said polymer molecule comprising:

a first moiety attached to a first location; and a second moiety attached to a second location;

wherein the application of a second electric field causes said polymer molecule to assume a linear shape, separating said first and second moities to effect a first color state.

16. The ink of claim 15, wherein the application of a third electric field causes causing the polymer molecule to assume a second non-linear shape, causing said first and second moieties to react to effect a second color state.

17. The ink of claim 16, wherein said first and third electric fields are the same field.

18. An electrically addressable medium comprising a microcapsule, said microcapsule further comprising a non-colored dye solvent complex, said dye solvent complex being stable when no electric field is applied and wherein applying an electric field causes said dye solvent complex to separate into a dye complex and a solvent complex, effecting a first color state.

* * * * *